(12) United States Patent
Kim et al.

(10) Patent No.: US 11,101,231 B2
(45) Date of Patent: Aug. 24, 2021

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Jong-youn Kim, Seoul (KR); Seok-hyun Lee, Hwaseong-si (KR); Youn-ji Min, Seoul (KR); Kyoung-lim Suk, Suwon-si (KR); Seok-won Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/819,851

(22) Filed: Mar. 16, 2020

(65) Prior Publication Data

US 2020/0219834 A1 Jul. 9, 2020

Related U.S. Application Data

(63) Continuation of application No. 15/869,678, filed on Jan. 12, 2018, now Pat. No. 10,622,320.

(30) Foreign Application Priority Data

Jul. 24, 2017 (KR) .................... 10-2017-0093693

(51) Int. Cl.
*H01L 21/48* (2006.01)
*H01L 23/00* (2006.01)
(Continued)

(52) U.S. Cl.
CPC .......... *H01L 24/06* (2013.01); *H01L 21/4857* (2013.01); *H01L 21/6835* (2013.01);
(Continued)

(58) Field of Classification Search
CPC . H01L 24/05; H01L 21/76898; H01L 23/481; H01L 23/3121; H01L 23/5226; H01L 23/5283; H01L 2224/02379
See application file for complete search history.

(56) References Cited

U.S. PATENT DOCUMENTS 9,129,944 B2   9/2015 Yu et al.
9,362,256 B2   6/2016 Hu
(Continued)

*Primary Examiner* — Hoa B Trinh
(74) *Attorney, Agent, or Firm* — Sughrue Mion, PLLC

(57) ABSTRACT

Provided is a semiconductor package including a semiconductor chip, a molding portion surrounding at least a side surface of the semiconductor chip, a passivation layer including a contact plug connected to the semiconductor chip and having a narrowing width further away from the semiconductor chip in a vertical direction, below the semiconductor chip, and a redistribution layer portion electrically connecting the semiconductor chip with an external connection terminal, below the passivation layer. The redistribution layer portion includes an upper pad connected to the contact plug and a fine pattern positioned at a same level as the upper pad, a redistribution layer and a via plug, which has a widening width further away from the semiconductor chip in the vertical direction, and a lower pad connected to the external connection terminal and exposed to an outside of the semiconductor package in a lower part of the redistribution layer portion.

20 Claims, 20 Drawing Sheets

(51) Int. Cl.
*H01L 23/522* (2006.01)
*H01L 23/528* (2006.01)
*H01L 23/31* (2006.01)
*H01L 21/683* (2006.01)
*H01L 25/065* (2006.01)
*H01L 23/498* (2006.01)

(52) U.S. Cl.
CPC ...... *H01L 23/3121* (2013.01); *H01L 23/3128* (2013.01); *H01L 23/49822* (2013.01); *H01L 23/5226* (2013.01); *H01L 23/5283* (2013.01); *H01L 25/0655* (2013.01); *H01L 23/49816* (2013.01); *H01L 24/16* (2013.01); *H01L 2221/68345* (2013.01); *H01L 2224/02379* (2013.01); *H01L 2224/13111* (2013.01); *H01L 2224/16112* (2013.01); *H01L 2224/16238* (2013.01); *H01L 2224/32225* (2013.01); *H01L 2224/73204* (2013.01); *H01L 2224/81192* (2013.01); *H01L 2224/81815* (2013.01); *H01L 2224/83104* (2013.01); *H01L 2224/92125* (2013.01); *H01L 2224/97* (2013.01); *H01L 2924/15174* (2013.01); *H01L 2924/15311* (2013.01); *H01L 2924/181* (2013.01)

(56) References Cited

U.S. PATENT DOCUMENTS

| | | | |
|---|---|---|---|
| 9,455,219 | B2 | 9/2016 | Shimizu et al. |
| 9,490,231 | B2 | 11/2016 | Ko et al. |
| 9,583,460 | B2 | 2/2017 | Ray et al. |
| 9,978,700 | B2 * | 5/2018 | Lin .................. H01L 24/96 |
| 10,418,298 | B2 * | 9/2019 | Lin .................. H01L 24/19 |
| 2016/0141262 | A1 | 5/2016 | Hu |
| 2016/0284620 | A1 | 9/2016 | Hu |
| 2016/0358847 | A1 | 12/2016 | Shih et al. |
| 2017/0011934 | A1 | 1/2017 | Hu |
| 2017/0084548 | A1 | 3/2017 | Hu |
| 2017/0098589 | A1 | 4/2017 | Liu et al. |
| 2017/0271203 | A1 | 9/2017 | Liu |
| 2019/0013276 | A1 | 1/2019 | Lee |

* cited by examiner (a)          (b)

SEMICONDUCTOR PACKAGE AND METHOD OF MANUFACTURING THE SAME

CROSS-REFERENCE TO THE RELATED APPLICATIONS

This application is a continuation of U.S. application Ser. No. 15/869,678, filed Jan. 12, 2018, claims priority from Korean Patent Application No. 10-2017-0093693, filed on Jul. 24, 2017, in the Korean Intellectual Property Office, the disclosure of which is incorporated herein in its entirety by reference.

BACKGROUND

The inventive concept relates to a semiconductor package and a method of manufacturing the semiconductor package, and more particularly, to a semiconductor package including a redistribution layer and a method of manufacturing the semiconductor package.

Recently, demand for portable devices has been rapidly increasing in the electronic products market, and thus there is a continuing demand for miniaturization and weight reduction of electronic components mounted on these electronic products. In order to miniaturize and lighten the electronic components, the overall thickness of a semiconductor package is decreasing, and demand for increased capacity of memory is ever present. A wafer-level package is applied in order to efficiently arrange semiconductor chips within the structure of a semiconductor package, which has a limited size, and thus the overall thickness of the semiconductor package is continuously decreasing.

SUMMARY

The inventive concept provides a semiconductor package capable of realizing a redistribution layer having a fine line width without a step difference in a fan-out wafer level package (FO-WLP) and a method of manufacturing the semiconductor package.

According to an aspect of an example embodiment, there is provided a semiconductor package which may include a semiconductor chip; a molding portion configured to surround at least a side surface of the semiconductor chip; a passivation layer including a contact plug connected to the semiconductor chip and having a narrowing width further away from the semiconductor chip in a vertical direction, below the semiconductor chip; and a redistribution layer portion electrically connecting the semiconductor chip with an external connection terminal, below the passivation. The redistribution layer portion may include: an upper pad connected to the contact plug and a fine pattern positioned at a same level as the upper pad in an upper part of the redistribution layer portion; a redistribution layer and a via plug, which has a widening width further away from the semiconductor chip in the vertical direction, in a body part of the redistribution layer portion; and a lower pad connected to the external connection terminal and exposed to an outside of the semiconductor package in a lower part of the redistribution layer portion.

According to another aspect of an example embodiment, there is provided a semiconductor package which may include a semiconductor chip; a molding portion configured to surround at least a side surface of the semiconductor chip; a passivation layer including a contact plug below the semiconductor chip; and a redistribution layer portion including a plurality of unit redistribution layers below the passivation layer. Each of the plurality of unit redistribution layers may include a via plug and a redistribution layer. A redistribution layer included in the unit redistribution layer disposed in an uppermost portion may have a first width, and redistribution layers included in other unit redistribution layers have a second width greater than the first width.

According to an aspect of an example embodiment, there is provided a semiconductor package which may include a plurality of semiconductor chips arranged side by side in a longitudinal direction; a molding portion configured to surround at least side surfaces of the plurality of semiconductor chips; a passivation layer including a first opening having an inverted trapezoidal vertical cross-sectional shape below at least one semiconductor chip of the plurality of semiconductor chips; a contact plug configured to fill the first opening; and a redistribution layer portion including an insulating portion having a second opening in an orthogonal trapezoidal vertical cross-sectional shape and a via plug configured to fill the second opening, below the passivation layer.

BRIEF DESCRIPTION OF THE DRAWINGS

The above and/or other aspects will be more clearly understood from the following detailed description taken in conjunction with the accompanying drawings in which.

DETAILED DESCRIPTION OF THE EMBODIMENTS

Hereinafter, example embodiments will be described in detail with reference to the accompanying drawings.

Figure 1:
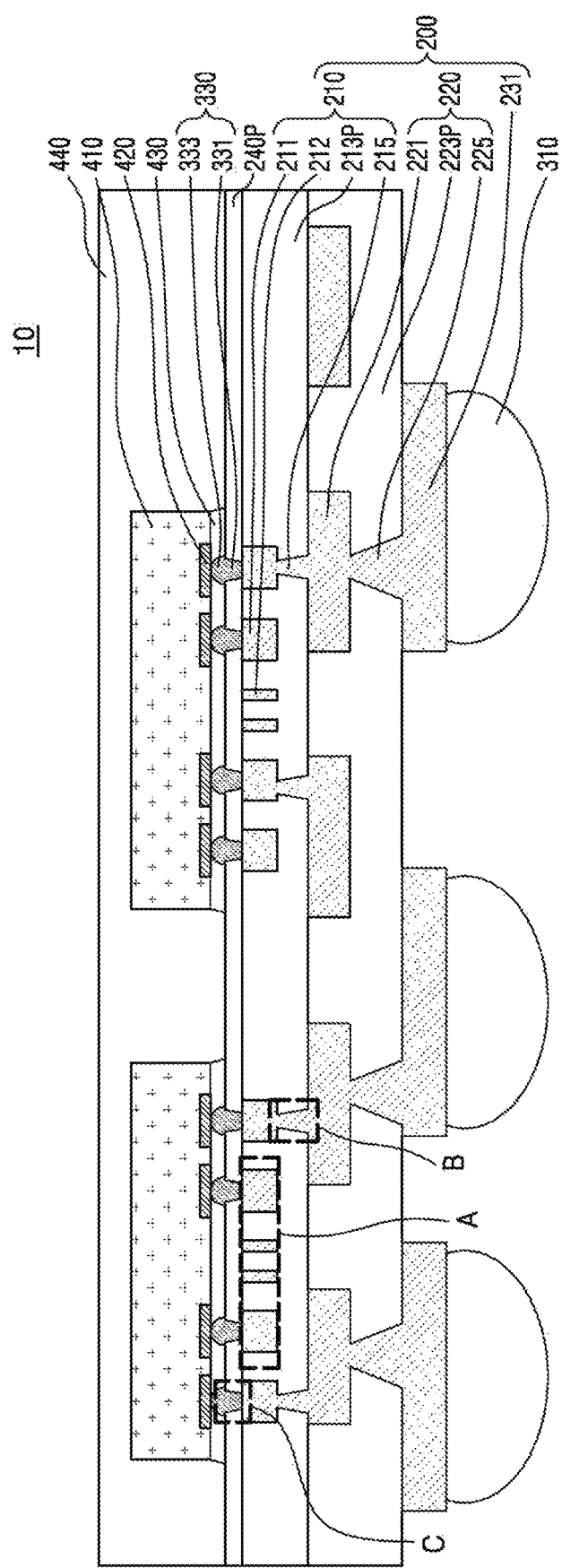
FIG. 1 is a cross-sectional view of a semiconductor package, according to an example embodiment.

FIG. 1 is a cross-sectional view of a semiconductor package 10, according to an example embodiment.

Referring to FIG. 1, the semiconductor package 10 may include at least one semiconductor chip 410, a molding portion 440 surrounding a side surface and an upper surface of the semiconductor chip 410, a passivation pattern layer 240P including a contact plug 330 directly contacting a connection pad 420 of the semiconductor chip 410, and a redistribution layer portion 200 electrically connecting the semiconductor chip 410 and an external connection terminal 310.

In a semiconductor package, when a size of a semiconductor chip is reduced or the number of input/output terminals is increased, there is a limit to accommodating all external connection terminals, which are the input/output terminals, in a main surface of the semiconductor chip. Accordingly, a fan-out wafer level package (FO-WLP) or a fan-out panel level package (FO-PLP) that include the external connection terminals by extending a redistribution layer portion to a molding portion forming an outer circumferential surface of the semiconductor chip may be applied to the semiconductor package. Hereinafter, the FO-WLP and the FO-PLP are referred to as the FO-WLP.

The semiconductor package 10 according to the inventive concept may be implemented, particularly, using a chip-last manufacturing method of firstly forming a redistribution layer on a support substrate and then mounting a semiconductor chip on the formed redistribution layer among various methods of manufacturing the FO-WLP.

In the conventional FO-WLP structure, when a redistribution layer portion is formed, a step difference (e.g., difference in height) may be formed in an insulating layer surrounding the redistribution layer portion by a concave-convex pattern of a previously formed lower redistribution layer. Due to such a step difference, when an upper redistribution layer is formed later, defects may be caused during an exposure process, and it may not be possible to achieve a fine line width of the upper redistribution layer. Also, even if the upper redistribution layer having the fine line width is formed, a bonding failure with the semiconductor chip may be caused due to a step difference of the upper redistribution layer. In particular, the more the unit redistribution layers constituting the redistribution layer portion in the semiconductor package are formed in multiple layers, the more the defects may become serious.

Therefore, in order to solve such a defect, the semiconductor package 10 according to the inventive concept performs a manufacturing method of firstly forming an upper pad 211 and a fine pattern 212 formed on an upper portion of the redistribution layer portion 200 on the support substrate. The manufacturing method may minimize an influence of the step difference of the insulating layer, reduce defects of the fine pattern 212 in the exposure process, and provide a structure capable of more stable bonding between the semiconductor chip 410 and the upper pad 211.

The semiconductor package 10 manufactured by the above manufacturing method may have the following three characteristics.

First, an upper surface of the upper pad 211 and an upper surface of the fine pattern 212 formed on the upper portion of the redistribution layer portion 200 may be substantially coplanar, as indicated by a portion A. This is because the upper pad 211 and the fine pattern 212 are first formed on the support substrate, and thus it is free from the influence of the step difference occurring in a subsequent process.

Second, as indicated by a portion B, the semiconductor package 10 may include, a first via plug 215 having an orthogonal trapezoidal vertical cross-sectional shape that widens farther away from the semiconductor chip 410 in a vertical direction. This is a phenomenon that occurs because the first and second via plugs 215 and 225 formed on a body portion of the redistribution layer portion 200 are formed later than the upper pad 211 and the fine pattern 212 and then the redistribution layer portion 200 is turned over and the semiconductor chip 410 is mounted on the redistribution layer portion 200.

Third, as indicated by a portion C, the semiconductor package 10 may include a contact plug 330 connected to the semiconductor chip 410 and having a lower contact plug 331 of an inverted trapezoidal vertical cross-sectional shape that narrows farther away from the semiconductor chip 410 in a vertical direction. This is a phenomenon that occurs because the contact plug 330 directly contacting the upper pad 211 formed on the upper portion of the redistribution layer portion 200 is formed after the redistribution layer portion 200 is turned over.

The redistribution layer portion 200 of the semiconductor package 10 may include the upper pad 211 connected to the contact plug 330 in an upper portion thereof and the fine pattern 212 located at the same level as the upper pad 211, the first and second via plugs 215 and 225 that widens farther away from a second redistribution layer 221 and the semiconductor chip 410 in the body portion in the vertical direction, and a lower pad 231 connected to the external connection terminal 310 and exposed to the outside at a lower portion thereof.

Hereinafter, a method of manufacturing the semiconductor package 10 will be described in detail.

FIGS. 2 through 17 are cross-sectional views for explaining a method of manufacturing a semiconductor package, according to an example embodiment, illustrated according to process order.

Figure 2:
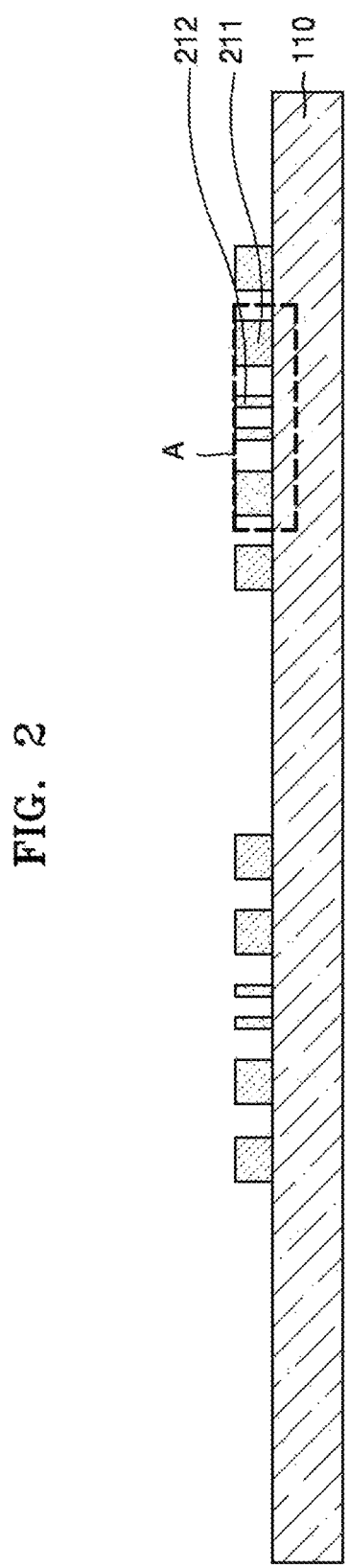
FIGS. 2 through 17 are cross-sectional views for explaining a method of manufacturing a semiconductor package, according to an example embodiment, illustrated according to a process order.

Referring to FIG. 2, a support substrate 110 may be provided. In forming the semiconductor package 10 (see FIG. 1), the support substrate 110 may be used to support various material layers, and may be removed from the semiconductor package 10 later if necessary.

The support substrate 110 may support an insulating layer and a conductive layer, and may be made of any material having stability with respect to a baking process, an etching process, and the like. In some example embodiments, if the support substrate 110 is later to be separated and removed by laser ablation, it may be a translucent substrate. In other example embodiments, if the support substrate 110 is later to be separated and removed by heating, it may be a heat resistant substrate.

In some example embodiments, the support substrate 110 may be a glass substrate. In other example embodiments, the support substrate 110 may be made of a heat resistant organic polymer material such as polyimide, polyetheretherketone, polyethersulfone, polyphenylene sulfide, or the like, but is not limited thereto.

In some example embodiments, a laser reaction layer may be provided on the support substrate 110. The laser reaction layer is vaporized in response to irradiation of laser later, and thus the support substrate 110 may be separable. The laser reaction layer may be a carbon-based material layer. For example, the laser reactive layer may include an amorphous carbon layer or a spin-on-carbon layer including a hydrocarbon compound or derivative thereof having a relatively high carbon content of about 85 wt % to about 99 wt % with respect to a total weight. In other example embodiments, the laser reactive layer may not be formed.

Thereafter, a protective layer may be further formed on the laser reaction layer. The protective layer may prevent contamination due to diffusion of materials between various material layers added in a subsequent process and the laser reaction layer. Also, the protective layer may prevent various material layers added in the subsequent process from being affected by a laser irradiated when the support substrate 110 is separated. In other example embodiments, the protective layer may not be formed.

For the convenience of explanation, it is assumed that the laser reaction layer and the protective layer are formed on the support substrate 110.

The upper pad 211 and the fine pattern 212 are formed on the support substrate 110. The upper pad 211 and the fine pattern 212 may be formed by forming a first conductive layer on the support substrate 110 and then patterning the first conductive layer.

First, the first conductive layer may be formed by a plating process or a physical vapor deposition process. The first conductive layer may be formed of copper (Cu), nickel (Ni), gold (Au), chrome (Cr), titanium (Ti), or palladium (Pd), or an alloy thereof.

Thereafter, the first conductive layer is patterned by using an exposure process and an etching process to form the upper pad 211 and the fine pattern 212. Since the upper pad 211 and the fine pattern 212 are formed on flat layers already formed on the support substrate 110, for example, the laser reaction layer and the protective layer, upper surfaces of the upper pad 211 and the fine pattern 212 may be formed to be coplanar. Hereinafter, the upper pad 211 and the fine pattern 212 may be referred to as a first distribution layer since they are firstly formed redistribution layers among redistribution layers constituting the redistribution layer portion 200 (see FIG. 1).

Figure 3:
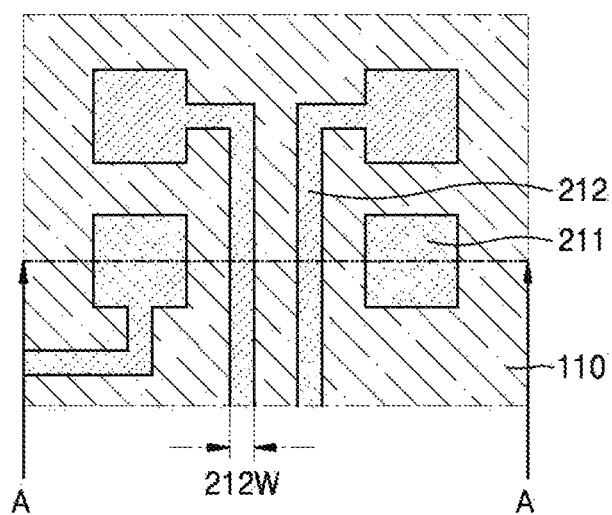

FIG. 3 shows a portion A of FIG. 2 viewed from above. In other words, a section cut along a line A-A corresponds to the portion A in FIG. 2.

The fine pattern 212 may be a conductive structure electrically connected to the upper pad 211 and made of the same material as the upper pad 211.

The fine pattern 212 may have a smallest line width 212W as compared with other redistribution layers formed in the redistribution layer portion 200 (see FIG. 1). A plurality of the fine patterns 212 may be formed and at least one of the plurality of fine patterns 212 may be formed between two adjacent upper pads 211. That is, the line width 212W of the fine pattern 212 may be smaller than an interval between the adjacent upper pads 211. In another example embodiment, some of the upper pads 211 may not be electrically connected to the fine pattern 212.

Figure 4:
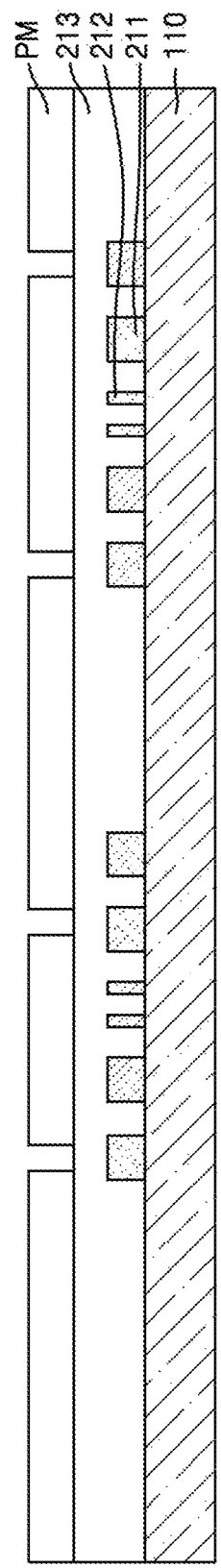

Referring to FIG. 4, a first insulating layer 213 may be formed on the support substrate 110 so as to fill surroundings of the upper pad 211 and the fine pattern 212 and wholly cover upper surfaces of the upper pad 211 and the fine pattern 212. The first insulating layer 213 may be formed of an oxide such as silicon oxide, a nitride such as silicon nitride, or a photosensitive insulating layer such as a photo-imageable dielectric (PID).

A photomask pattern PM may be formed on the first insulating layer 213. After a photoresist is coated on the first insulating layer 213, if the photoresist is exposed and developed, as shown in the figure, only a part of the photoresist remains and the remaining part is removed to form the photomask pattern PM.

The photomask pattern PM may be a pattern arranged according to a predetermined rule or a pattern arranged irregularly. The thickness and the width of the photomask pattern PM may be adjusted to affect a shape of a first via hole 213H (see FIG. 5) included in a first insulation pattern layer 213P (see FIG. 5).

Figure 5:
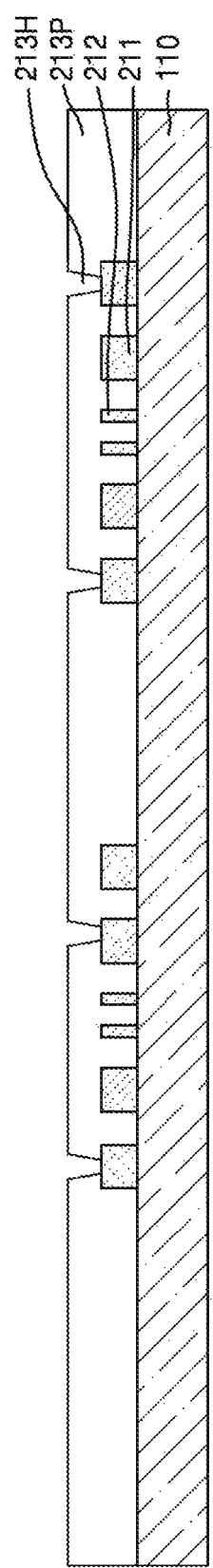

Referring to FIG. 5, a part of the first insulating layer 213 (see FIG. 4) is etched using the photomask pattern PM (see FIG. 4) as an etching mask, and the photomask pattern PM is removed through an ashing and stripping process.

The etching may be dry etching. Through the dry etching, the first insulation pattern layer 213P including the plurality of first via holes 213H is formed. Due to a characteristic of the etching process, the first via hole 213H may have a tapered side wall that is narrower downward other than a vertical side wall.

In other example embodiments, the first via hole 213H may have a side wall that is substantially perpendicular to an upper surface of the support substrate 110. In this case, the first via hole 213H may have a rectangular cross-sectional shape.

The first via hole 213H partially exposes the upper pad 211. Also, when an exposed part of the upper pad 211 is viewed from the upper surface, it may be circular. That is, the first insulation pattern layer 213P may include the plurality of first via holes 213H in a cylindrical shape.

Figure 6:
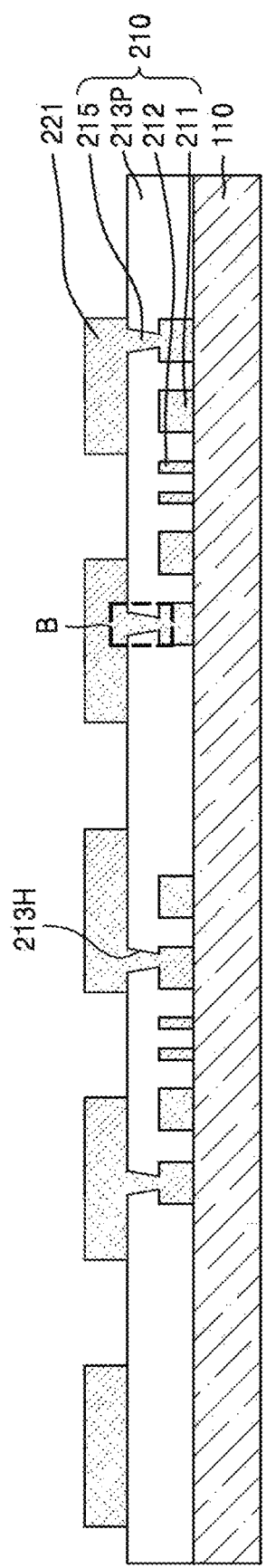

Referring to FIG. 6, a first via plug 215 is formed in the first via hole 213H, and the second redistribution layer 221 is formed on the first via plug 215.

The inside of the first via hole 213H may be filled with a conductive material. The inside of the first via holes 213H may be filled with the conductive material in various ways, for example, by an electrolytic plating process, an electroless plating process, a physical vapor deposition process, a chemical vapor deposition process, or the like.

The first via plug 215 may be formed of copper (Cu), nickel (Ni), gold (Au), chrome (Cr), titanium (Ti), palladium (Pd), or an alloy thereof. In some example embodiments, the first via plug 215 may be formed by a plating process, and a metal may be plated on a seed layer. The first via plug 215 and the seed layer may be formed of the same metal, for example, copper (Cu).

A second conductive layer may be formed on an upper surface of the first via plug 215 and an upper surface of the first insulation pattern layer 213P. The second conductive layer may be formed of the same metal as the first via plug 215. The second conductive layer may be formed by electroplating. The second redistribution layer 221 is formed by patterning the second conductive layer using an exposure process and an etching process.

In some example embodiments, the first via plug 215 and the second redistribution layer 221 may be formed simultaneously through a damascene process. In other example embodiments, the second redistribution layer 221 may be formed through a lift-off process. The damascene process and the lift-off process are the same as those known in the art, and thus detailed descriptions thereof are herein omitted.

Thus, the first redistribution layer—the upper pad 211 and the fine pattern 212, the first via plug 215, and the first insulation pattern layer 213P constituting a first unit redistribution layer 210 may be wholly formed.

Figure 7:
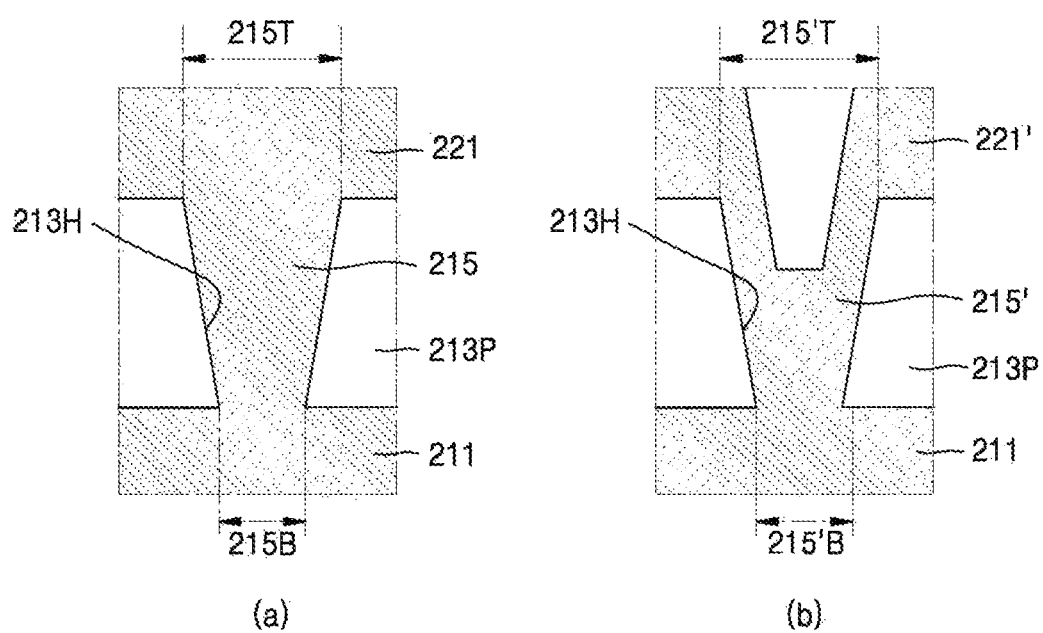

FIG. 7 shows enlarged views of the portion B of FIG. 6.

Since the first via hole 213H is filled with the first via plug 215, the first via plug 215 may have a cross-sectional shape having a width of an upper surface larger than a width of a lower surface in the same manner as the first via hole 213H.

Referring to view (a) of FIG. 7, a width 215B of the lower surface of the upper pad 211, that is, the first via plug 215 contacting the first redistribution layer may be smaller than a width 215T of the upper surface of the first via plug 215 contacting the second redistribution layer 221. The first via plug 215 may fill the first via hole 213H. That is, the upper surface of the first via plug 215 may be a flat surface.

Referring to view (b) of FIG. 7, a width 215'B of the lower surface of the upper pad 211, that is, a first via plug 215' contacting the first redistribution layer may be smaller than a width 215'T of the upper surface of the first via plug 215' contacting a second redistribution layer 221'. The first via plug 215' may be formed along a sidewall of the first via hole 213H. That is, a recess may be formed at a predetermined depth in a center of the first via plug 215'. This may be different depending on a manufacturing method of forming the second conductive layer.

Figure 8:
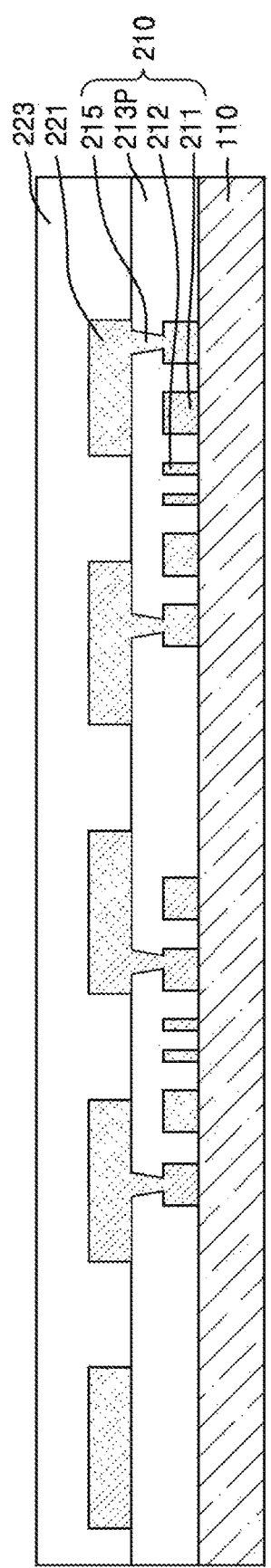

Referring to FIG. 8, a second insulating layer 223 is formed on the first insulation pattern layer 213P to fill surrounding of the second redistribution layer 221 and cover the entire upper surface of the second redistribution layer 221.

The second insulating layer 223 may be formed of an oxide such as silicon oxide, a nitride such as silicon nitride, or a photosensitive insulating film such as a photoimageable dielectric (PID).

In some example embodiments, the second insulating layer 223 may be formed of silicon oxide or silicon nitride. The silicon-based insulating layer has excellent insulation performance and is formed to reflect a shape of a lower layer. Therefore, depending on a shape of the second redistribution layer 221, the second insulation layer 223 may have a profile of a concavo-convex structure. The profile of the second insulating layer 223 may be substantially the same as a profile of the second redistribution layer 221, or may be formed to have a roughly similar shape. The shape of the second insulating layer 223 may vary depending on materials used, process conditions, and subsequent processing, etc.

In other example embodiments, the second insulating layer 223 may be formed as a photosensitive insulating layer. The photosensitive insulating layer is formed to have a flat upper surface without reflecting the shape of the lower layer. Therefore, regardless of the shape of the second redistribution layer 221, the second insulation layer 223 may have a flat profile.

For convenience of explanation, the second insulating layer 223 is shown as having a flat surface.

Figure 9:
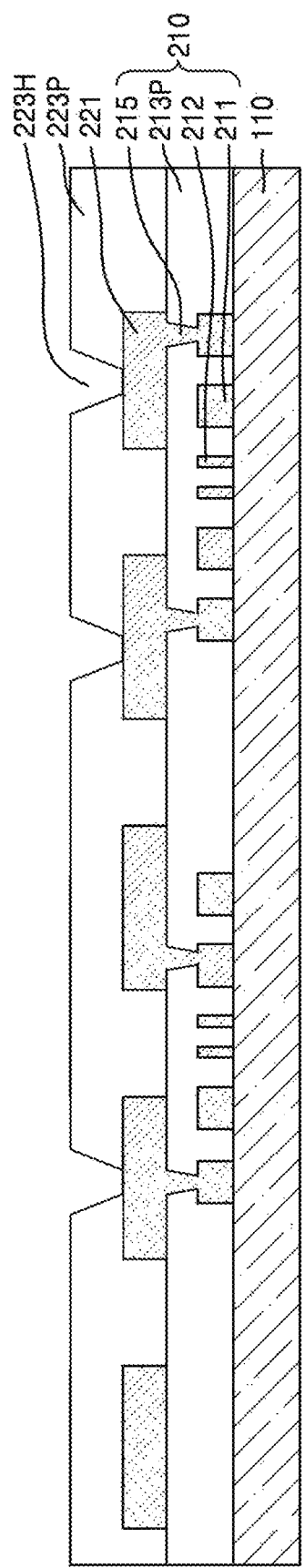

Referring to FIG. 9, a part of the second insulating layer 223 (see FIG. 8) is etched using a photomask pattern as an etching mask, and the photomask pattern is removed by an ashing and stripping process.

The etching may be dry etching. Through the dry etching, a second insulating pattern layer 223P including a plurality of second via holes 223H is formed. Due to a characteristic of the etching process, the second via hole 223H may have a tapered sidewall that is narrower downward other than a vertical side wall.

In other example embodiments, the second via hole 223H may have a sidewall that is substantially perpendicular to an upper surface of the support substrate 110. In this case, the second via-hole 223H may have a rectangular cross-sectional shape.

The second via hole 223H partially exposes the second redistribution layer 221. Also, when an exposed part of the second redistribution layer 221 is viewed from the upper surface, it may be a circular shape. That is, the second insulation pattern layer 223P may include a plurality of second via holes 223H in a cylindrical shape.

Figure 10:
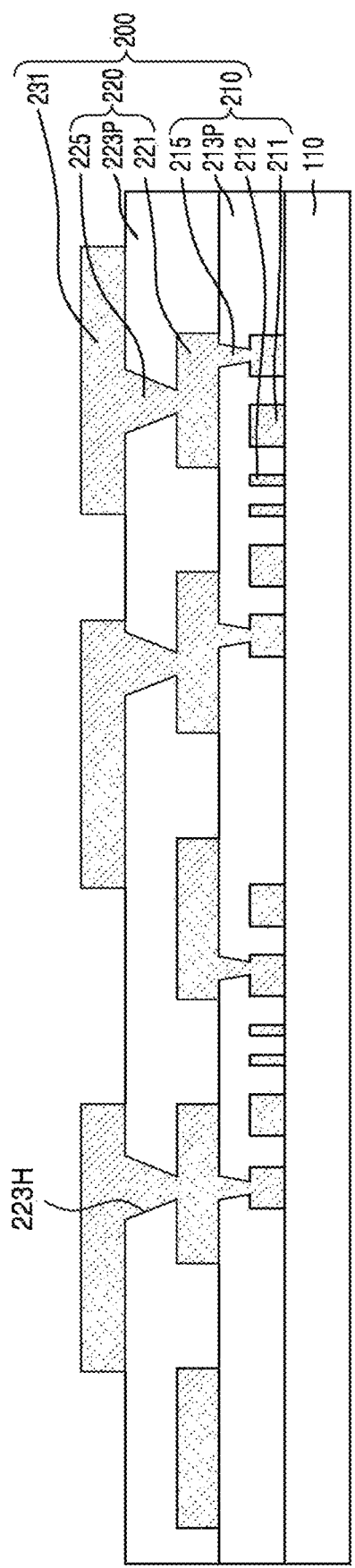

FIG. 10 shows a process of forming a second via plug 225 in the second via hole 223H and forming a lower pad 231 on the second via plug 225.

The inside of the second via hole 223H may be filled with a conductive material. The inside of the second via holes 223H may be filled with the conductive material in various ways, for example, by an electrolytic plating process, an electroless plating process, a physical vapor deposition process, a chemical vapor deposition process, or the like.

The second via plug 225 may be formed of copper (Cu), nickel (Ni), gold (Au), chromium (Cr), titanium (Ti), palladium (Pd), or an alloy thereof. In some embodiments, the second via plug 225 may be formed by a plating process, and a metal may be plated on a seed layer. The second via plug 225 and the seed layer may be formed of the same metal, for example, copper (Cu).

A third conductive layer may be formed on an upper surface of the second via plug 225 and an upper surface of the second insulation pattern layer 223P. The third conductive layer may be formed of the same metal as the second via plug 225. The third conductive layer may be formed by electroplating. The third conductive layer is patterned using an exposure process and an etching process to form the lower pad 231.

Thus, the second redistribution layer 221, the second via plug 225, and the second insulation pattern layer 223P constituting a second unit redistribution layer 220 may all be formed.

In this regard, the process of forming the first and second unit redistribution layers 210 and 220 has been described but is not limited thereto. However, three or more unit redistribution layers may be formed.

Figure 11:
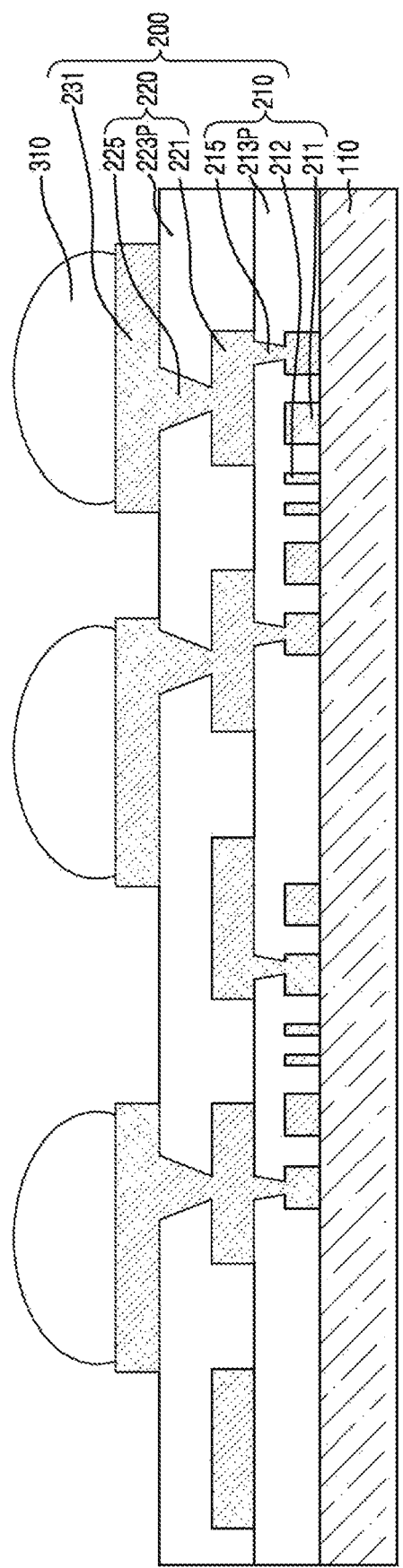

FIG. 11 shows the external connection terminal 310 formed on the lower pad 231.

In some embodiments, the external connection terminal 310 may be formed as a solder ball. The solder ball is formed to have a curved contour so that each of the lower pads 231 may be attached to an upper surface. In other example embodiments, the external connection terminal 310 may be formed as a reflow solder layer by forming a solder layer on the lower pad 231 and melting the solder layer by a reflow process.

A side surface of the lower pad 231 may not be covered with an insulating material. That is, a lower surface of the lower pad 231 is in contact with the second insulation pattern layer 223P, a side surface is exposed to the outside, and an upper surface is in contact with the external connection terminal 310. In other words, the lower pad 231 may protrude from the second insulation pattern layer 223P which is an insulating material.

Figure 12:
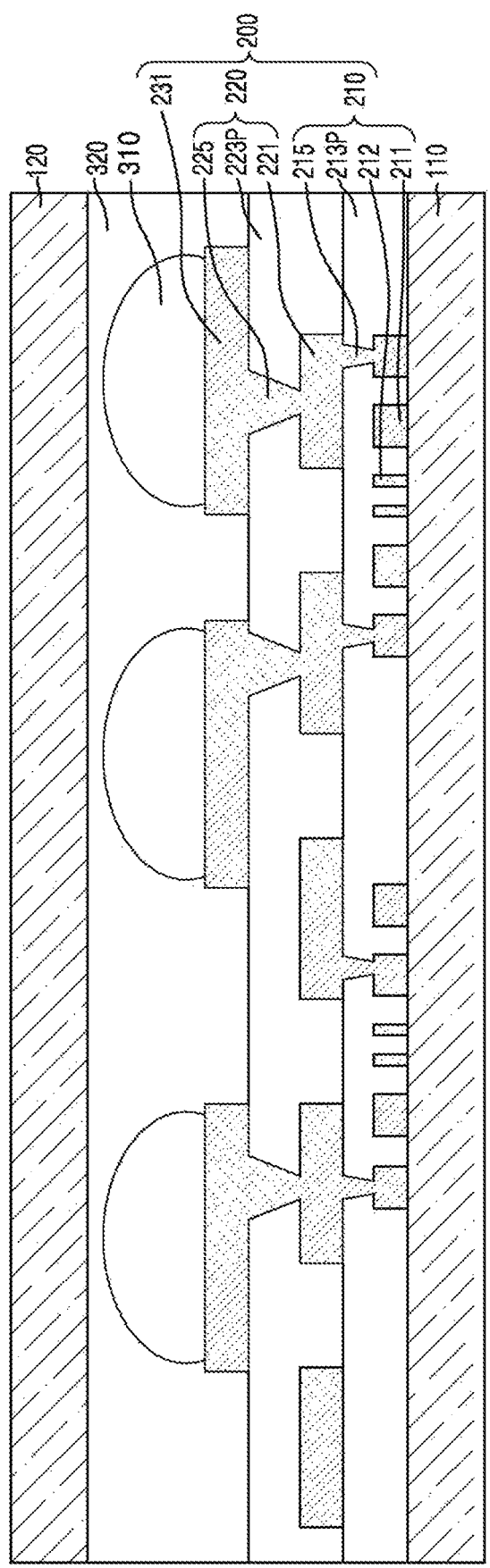

Referring to FIG. 12, a carrier substrate 120 may be attached onto a capping member 320 for capping the lower pad 231 and the external connection terminal 310 so as to face the capping member 320 and the support substrate 110.

Figure 15:
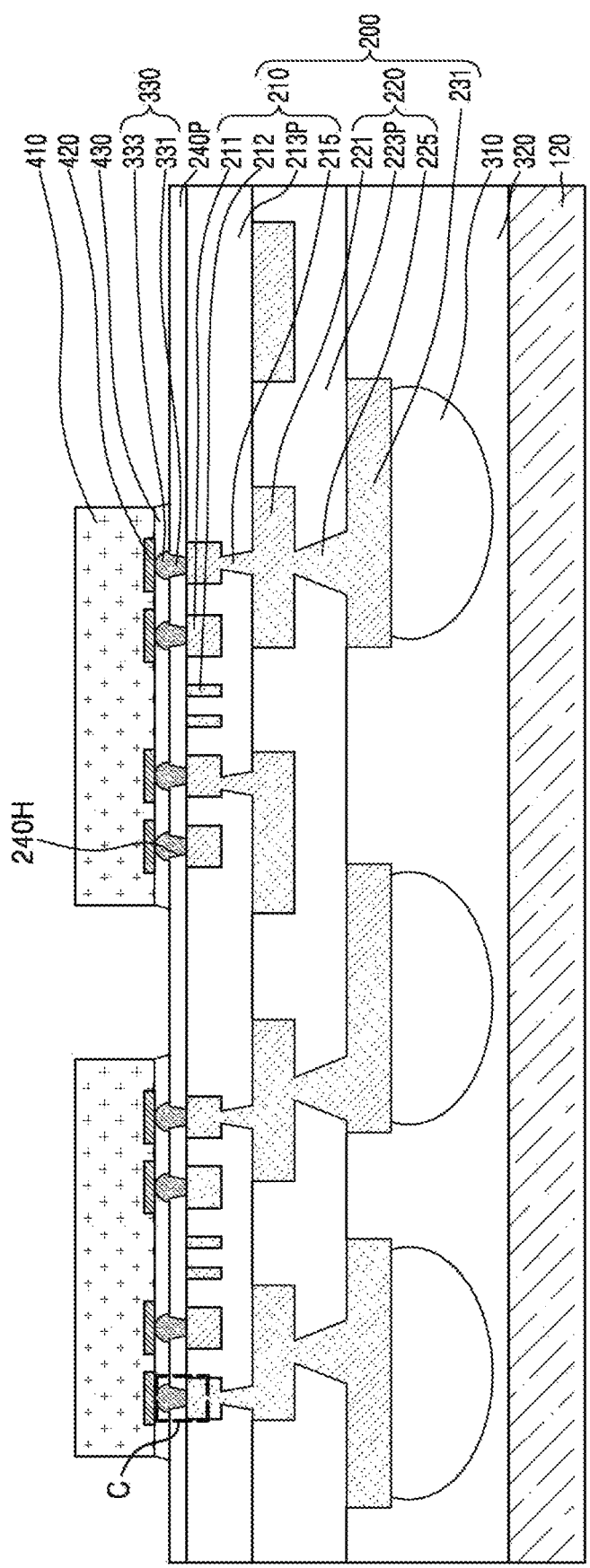

The carrier substrate 120 may be attached to perform a subsequent process such as removing the support substrate 110 and mounting the semiconductor chip 410 (see FIG. 15). The carrier substrate 120 may include, for example, glass, silicon, or aluminum oxide. An adhesive layer may be formed between the carrier substrate 120 and the capping member 320 to facilitate adhesion of the carrier substrate 120. The adhesive layer may be in the form of a liquid or gel which is easily deformable at a predetermined pressure.

In some example embodiments, a coupling structure in which the carrier substrate 120 and the capping member 320 are combined is first prepared, and the coupling structure may be attached onto a portion where the lower pad 231 and the external connection terminal 310 are formed by applying pressure thereto.

Figure 13:
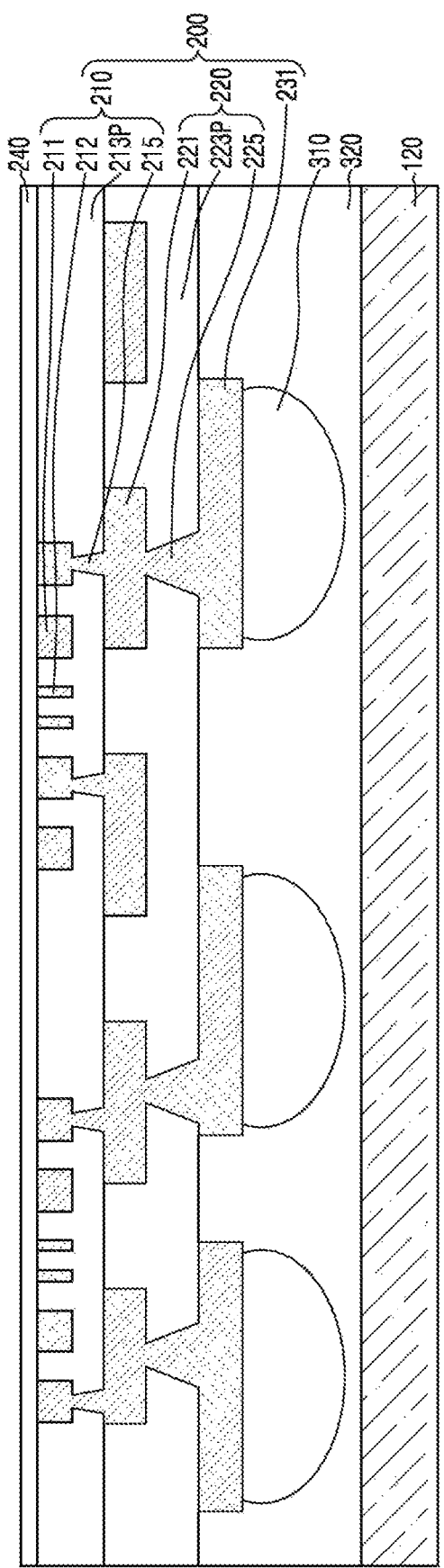

Referring to FIG. 13, a laser may be applied to the support substrate 110, to separate and remove the support substrate 110 (see FIG. 12). A bonding force between a laser reaction layer and the support substrate may be weakened by irradiation of the laser. In some embodiments, the laser reactive layer may be removed by irradiation of the laser.

Thereafter, a remaining laser reaction layer and a protective layer may be removed using an etching agent. The removal of the remaining laser reactive layer and the protective layer may be performed by wet etching or dry etching.

Thereafter, a subsequent process may be performed by turning the carrier substrate 120 over so that the carrier substrate 120 is positioned below. The passivation layer 240 may first be formed on the upper pad 211 and the fine pattern 212 to form the passivation pattern layer 240P (see FIG. 14). The passivation layer 240 may be a material layer composed of an organic compound. In some example embodiments, the passivation layer 240 may be a material layer composed of an organic polymeric material. In some example embodiments, the passivation layer 240 may include a polymeric material. In other example embodiments, the passivation layer 240 may include a photosensitive polyimide (PSPI) resin.

In some example embodiments, the passivation layer 240 may be formed by spin coating and soft baking. Soft baking may be performed, for example, while heating to a temperature of from about 150° C. to about 350° C. for about 10 seconds to about 5 minutes, but is not limited thereto.

Figure 14:
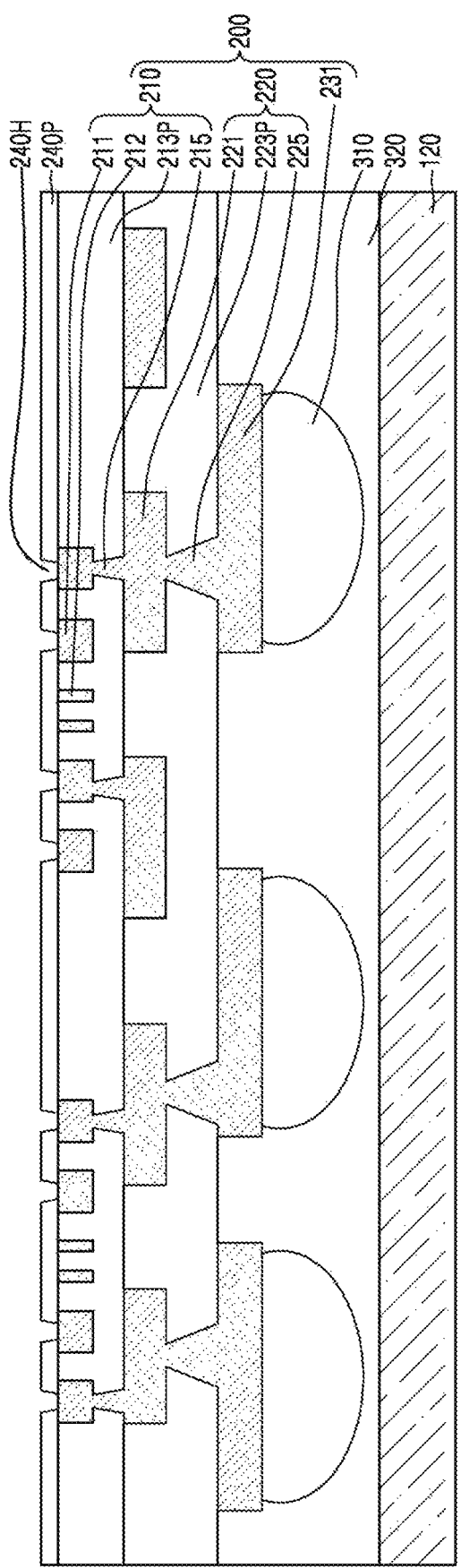

Referring to FIG. 14, the passivation layer 240 (see FIG. 13) may be subjected to an exposure process and a development process to form the passivation pattern layer 240P including a plurality of contact holes 240H.

In some example embodiments, when the passivation layer 240 includes a polymer material having negative photosensitivity, a part to be removed is shielded and a remaining part is exposed. In other example embodiments, when the passivation layer 240 includes a polymer material having positive photosensitivity, the part to be removed is exposed and the remaining part is shielded.

Through the exposure process and the development process, the passivation pattern layer 240P including the plurality of contact holes 240H is formed. Because of characteristics of the exposure process and the development process, the contact hole 240H may have a tapered sidewall that is narrower downward other than a vertical sidewall.

In other example embodiments, the contact hole 240H may have a substantially vertical sidewall. In this case, the contact hole 240H may have a rectangular cross-sectional shape. A part of the upper surface of the upper pad 211 may be exposed by the contact hole 240H.

Referring to FIG. 15, the contact plug 330 electrically connected to the upper pad 211 which is exposed may be formed, and the semiconductor chip 410 may be attached onto the contact plug 330.

The semiconductor chip 410 may include the connection pad 420. The semiconductor chip 410 may be a diced individual semiconductor die or a semiconductor die-molded sub-package. The semiconductor chip 410 may be in contact with the contact plug 330 through the connection pad 420. The contact plug 330 may be, for example, a tin-based solder material.

In order to form the contact plug 330, the solder layer may be subjected to a heat treatment to perform a reflow process. The reflow process may be performed at a temperature ranging from about 220° C. to about 260° C. The solder layer may be melted by the reflow process, and an upper contact plug 333 may be formed. Due to surface tension, the solder layer may not collapse after being melted and may form the upper contact plug 333 on the lower contact plug 331.

The semiconductor chip 410 is mounted with a main surface thereof on which the connection pad 420 is formed facing down such that the main surface of the semiconductor chip 410 may align with an upper surface of the carrier substrate 120.

In some example embodiments, the semiconductor chip 410 may be a logic chip or a memory chip. The logic chip may be, for example, a microprocessor, an analog device, or a digital signal processor. The memory chip may be a volatile memory chip such as a dynamic random access memory (DRAM) or a static random access memory (SRAM), or a non-volatile memory chip such as a phase change random access memory (PRAM), a magnetoresistive random access memory (MRAM), a ferroelectric random access memory (FeRAM), or resistive random access memory (RRAM). In some example embodiments, the semiconductor chip 410 may be a high-bandwidth memory (HBM) DRAM. In other example embodiments, the semiconductor chip 410 may be an interposer or a controller.

A gap may be formed between the contact plug 330 and the semiconductor chip 410 in an electrical connection process between the contact plug 330 and the semiconductor chip 410. Since the gap may cause problems in the connection reliability of the semiconductor chip 410 and the contact plug 330, an underfill 430 may be injected and hardened to reinforce the connection.

The semiconductor chip 410 is more stably fixed on the contact plug 330 by the underfill 430, and the semiconductor chip 410 is not electrically connected to the contact plug 330 despite a difference in a thermal expansion coefficient between the semiconductor chip 410 and the contact plug 330. The molding portion 440 (see FIG. 17) may, in some cases, be filled directly into the gap between the semiconductor chip 410 and the contact plug 330. In such cases, the underfill 430 may not be necessary.

In other example embodiments, at least one semiconductor chip among a plurality of semiconductor chips 410 may be mounted with the main surface on which the connection pad 420 is formed facing upward, and may be electrically connected to the redistribution layer portion 200 through a bonding wire.

Figure 16:
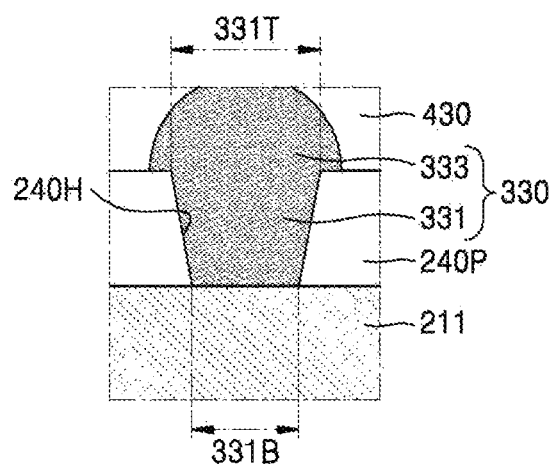

FIG. 16 shows an enlarged view of the portion C of FIG. 15.

Since the lower contact plug 331 of the contact plug 330 fills the contact hole 240H, the lower contact plug 330 may have a cross-sectional shape that narrows farther away from the semiconductor chip 410 in a vertical direction in the same manner as the contact hole 240H.

A width 331B of a lower surface of the lower contact plug 331 in contact with a first redistribution layer, is narrower than a width 331T of an upper surface in contact with the upper contact plug 333. The lower contact plug 331 may wholly fill the contact hole 240H.

Figure 17:
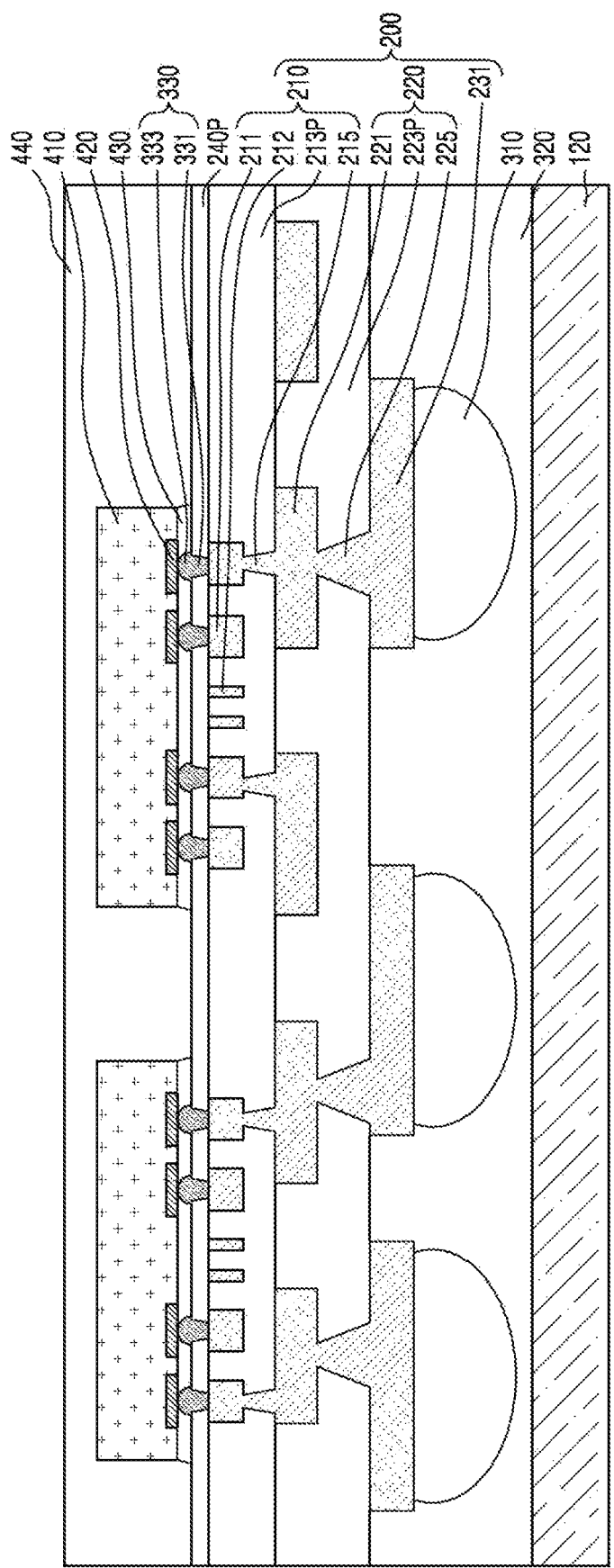

FIG. 17 shows the molding portion 440 formed covering a side surface and an upper surface of the semiconductor chip 410.

The molding portion 440 may protect the semiconductor chip 410 from external influences such as an impact, etc. In order to protect the semiconductor chip 410, the molding portion 440 may be formed of an epoxy mold compound (EMC) or a resin, etc. The molding portion 440 may be formed by a process such as compression molding, lamination, or screen printing, etc. In some example embodiments, the molding portion 440 may surround the side surface of the semiconductor chip 410 such that an upper surface of the semiconductor chip 410 may be exposed to the outside.

Thereafter, the capping member 320 and the carrier substrate 120 are removed to manufacture the semiconductor package 10 (see FIG. 1). In order to separate and remove the carrier substrate 120, the carrier substrate 120 may be irradiated with a laser beam. A bonding force between the capping member 320 and the carrier substrate 120 may be weakened by the laser irradiation.

Thereafter, the remaining capping member 320 may be removed using an etchant. Removal of the capping member 320 may be performed by wet etching or dry etching.

Figure 18:
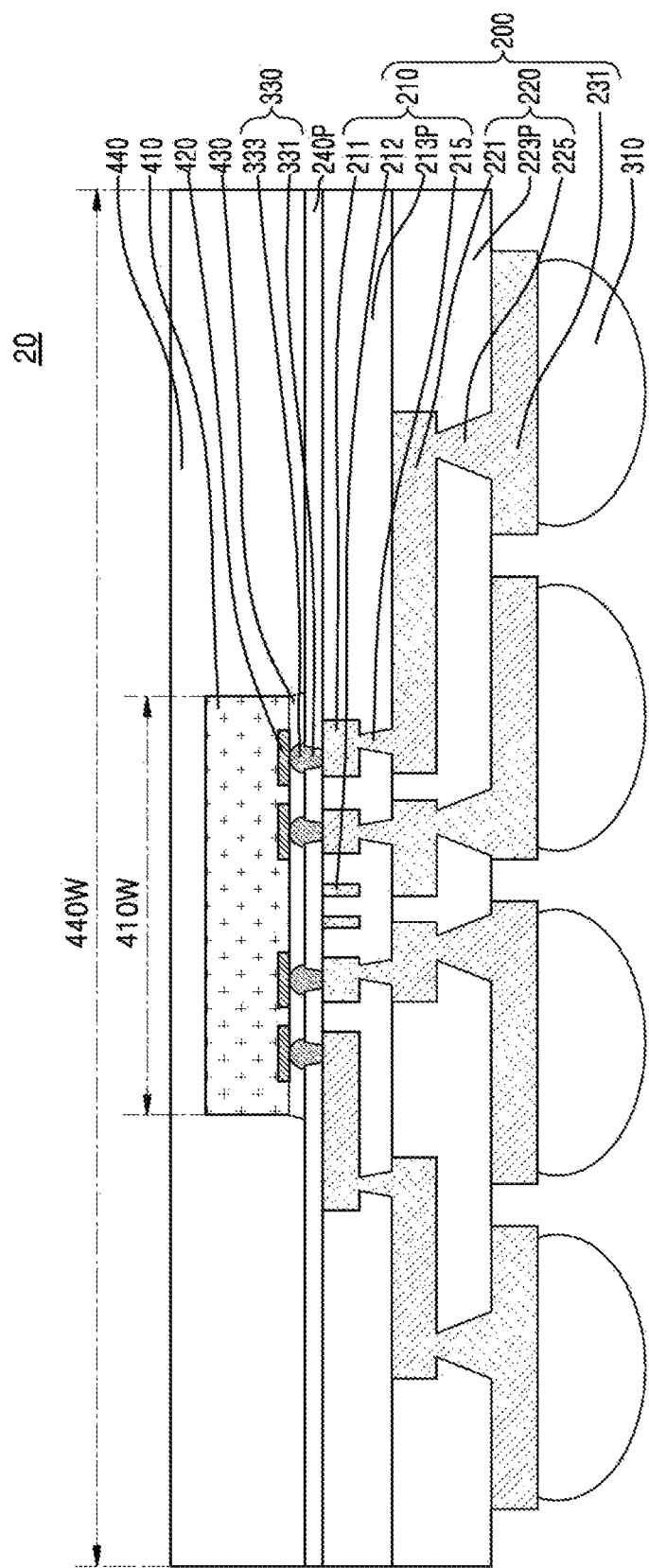
FIG. 18 is a cross-sectional view illustrating a semiconductor package, according to an example embodiment.

FIG. 18 is a cross-sectional view illustrating a semiconductor package 20 according to an example embodiment.

Referring to FIG. 18, the semiconductor package 20 may include the at least one semiconductor chip 410, the molding portion 440 surrounding a side surface of the semiconductor chip 410, the passivation pattern layer 240P including the contact plug 330 electrically connected to the connection pad 420 of the semiconductor chip 410, and the redistribution layer portion 200 electrically connecting the semiconductor chip 410 to the external connection terminal 310.

The semiconductor package 20 is substantially the same as the semiconductor package 10 shown in FIG. 1, except for a single semiconductor chip 410 being mounted and a shape of the molding portion 440. Therefore, for simplification of the description, the content already described is omitted here.

An FO-WLP structure including the external connection terminal 310 by extending the redistribution layer portion 200 to the molding portion 440 forming an outer circumferential surface of the semiconductor chip 410 is applied to the semiconductor package 20. That is, a width 410W of the semiconductor chip 410 is smaller than a width 440W of the molding portion 440. This is shown in a cross-sectional view. When the semiconductor package 20 is viewed from above, an area of the molding portion 440 may be greater than that of the semiconductor chip 410, and the area of the molding portion 440 may be substantially the same as that of the redistribution layer portion 200. An upper surface of the molding portion 440 may be at substantially the same level as an upper surface of the semiconductor chip 410. That is, the molding portion 440 may expose the upper surface of the semiconductor chip 410 to the outside.

Figure 19:
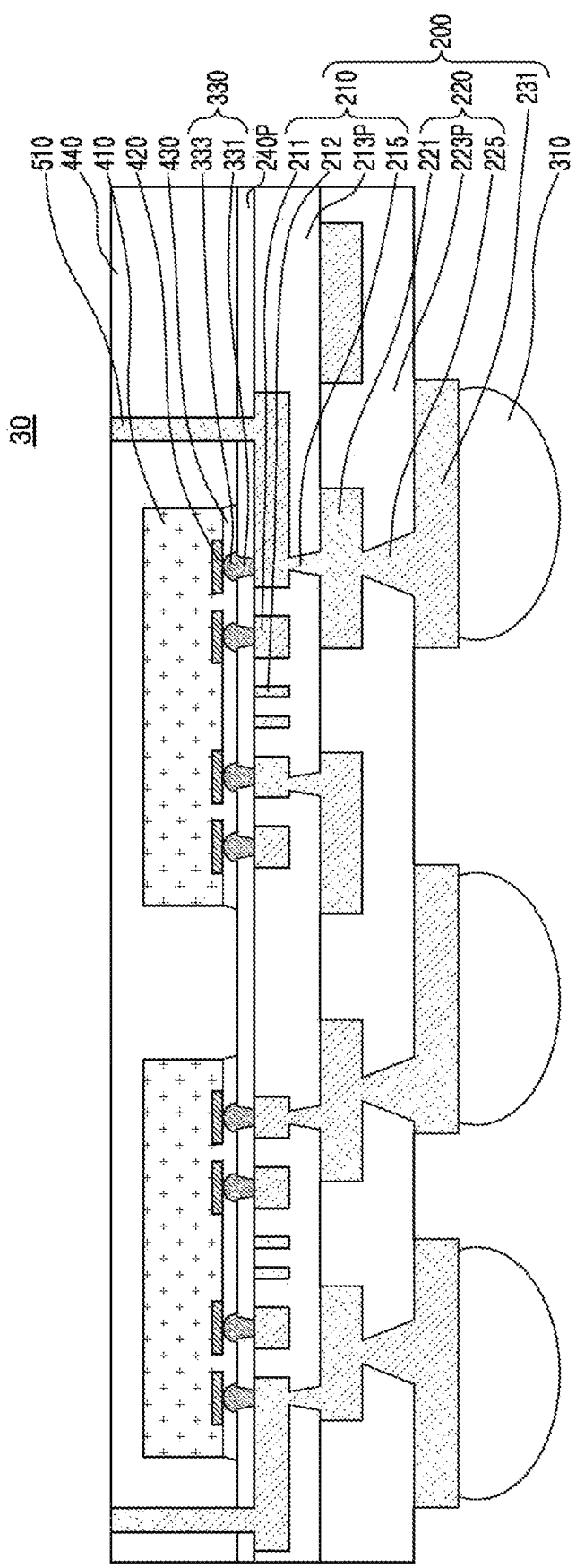
FIG. 19 is a cross-sectional view showing a semiconductor package, according to an example embodiment.

FIG. 19 is a cross-sectional view showing a semiconductor package 30 according to an example embodiment.

Referring to FIG. 19, the semiconductor package 30 may include through electrodes 510 on both sides of the semiconductor chip 410. The through electrodes 510 may be formed of a conductive material, and may be electrically connected to the exposed upper pad 211 of the redistribution layer portion 200.

The semiconductor package 10 is substantially the same as the semiconductor package 10 shown in FIG. 1 except for the through electrodes 510 formed in the semiconductor package 30. Therefore, for simplification of the description, the content already described is omitted here.

A side surface and an upper surface of the semiconductor chip 410 are covered by the molding portion 440. Side surfaces of the through electrodes 510 are covered by the molding portion 440, and upper surfaces of the through electrodes 510 are exposed. In some embodiments, the molding portion 440 may be formed to cover both the semiconductor chip 410 and the through electrodes 510, and then may be ground such that the upper surfaces of the through electrodes 510 may be exposed to the outside. In other example embodiments, the molding portion 440 is formed so as to cover all of the semiconductor chips 410, and then a through hole is formed in the molding portion 440 through an exposure process and an etching process, and then the through electrodes 510 may be formed.

The semiconductor package 30 may be electrically connected to another semiconductor package through the through electrodes 510. That is, another semiconductor package may be stacked on the semiconductor package 30.

Figure 20:
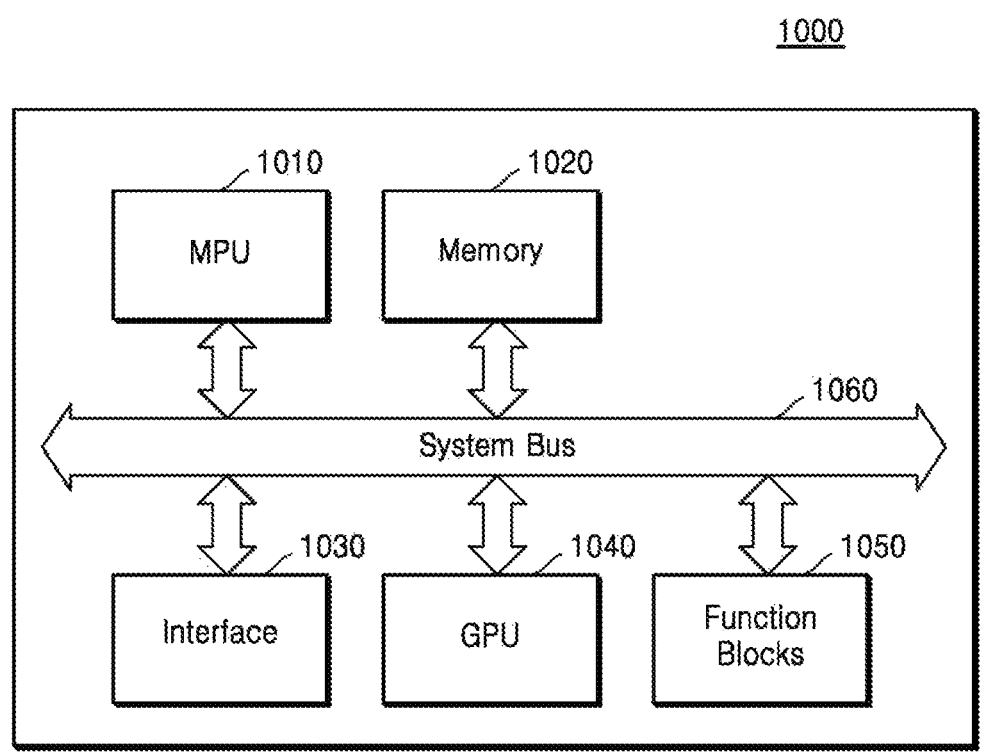
FIG. 20 is a schematic diagram of a configuration of a semiconductor package, according to an example embodiment.

FIG. 20 is a schematic diagram of a configuration of a semiconductor package 1000, according to an example embodiment.

Referring to FIG. 20, the semiconductor package 1000 may include a micro processing unit (MPU) 1010, a memory 1020, an interface 1030, a graphics processing unit (GPU) 1040, functional blocks 1050, and a bus 1060 connecting these elements. The semiconductor package 1000 may include both the MPU 1010 and the GPU 1040 or may include only one of the MPU 1010 and the GPU 1040.

The MPU 1010 may include a core and an Level 2 (L2) cache. For example, the MPU 1010 may include multi-cores. The multi-cores may have the same performance as each other or different performances from each other. Also, the multi-cores may be simultaneously activated or may have different activation time points.

The memory 1020 may store a result processed in the functional blocks 1050 by control of the MPU 1010. The interface 1030 may exchange information or signals with external apparatuses. The GPU 1040 may perform graphic functions. For example, the GPU 1040 may perform video codec or may process three-dimensional (3D) graphics. The functional blocks 1050 may perform various functions. For example, when the semiconductor package 1000 is an application processor (AP) used in a mobile apparatus, some of the functional blocks 1050 may perform a communication function.

The semiconductor package 1000 may include any one of the semiconductor packages 10, 20, and 30 described with reference to FIGS. 1, 18, and 19, respectively.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor package, the method comprising:

forming an upper pad and a fine pattern on a support substrate;

forming a first insulating layer filling surroundings of the upper pad and the fine pattern, the first insulating layer having a first via hole that has a widening width further away from the support substrate in a vertical direction;

forming a first via plug in the first via hole and forming a redistribution layer on the first via plug, the first via plug being connected to the upper pad;

forming a second insulating layer filling surroundings of the redistribution layer, the second insulating layer having a second via hole that has a widening width further away from the support substrate in the vertical direction;

forming a second via plug in the second via hole and forming a lower pad on the second via plug, the second via plug being connected to the redistribution layer;

attaching a carrier substrate onto the lower pad to face the support substrate and removing the support substrate;

forming a passivation layer on the upper pad and the fine pattern, the passivation layer having a contact hole that has a widening width further away from the carrier substrate in the vertical direction and comprising a material different from those of the first and second insulating layers;

forming a contact plug in the contact hole, the contact plug being connected to the upper pad; and attaching a semiconductor chip onto the contact plug.

2. The method of claim 1, further comprising:

after the attaching the semiconductor chip, forming an underfill filling between the semiconductor chip and the contact plug.

3. The method of claim 2, further comprising:

after the forming the underfill, forming a molding portion surrounding at least a side surface of the semiconductor chip.

4. The method of claim 1, further comprising:
after the forming the lower pad, forming an external connection terminal on the lower pad.

5. The method of claim 1, wherein vertical cross-sections of the first and second via plugs and a vertical cross-section of the contact plug have trapezoidal shapes tapered in directions opposite to each other.

6. The method of claim 1, wherein the first and second via plugs and the contact plug comprise different materials.

7. The method of claim 1, wherein the fine pattern comprises a plurality of fine patterns, and some of the plurality of fine patterns are located between two adjacent upper pads, and
wherein a width of each of the plurality of fine patterns is smaller than a width of the redistribution layer.

8. The method of claim 1, wherein the passivation layer comprises a photosensitive polyimide (PSPI) resin.

9. The method of claim 1, further comprising: after the forming the contact plug,
forming a molding portion covering the passivation layer;
forming a through electrode penetrating through the molding portion and connected to the upper pad; and
forming a mounting space of the semiconductor chip in the molding portion.

10. The method of claim 9, wherein an upper surface of the molding portion and an upper surface of the through electrode are substantially coplanar with each other.

11. A method of manufacturing a semiconductor package, the method comprising:
forming a silicon insulating layer on a support substrate, the silicon insulating layer having a pattern hole;
forming an upper pad and a fine pattern in the pattern hole, the fine pattern being positioned at a same level as the upper pad;
forming an insulating layer filling surroundings of the upper pad and the fine pattern, the insulating layer having a via hole that has a widening width further away from the support substrate in a vertical direction;
forming a via plug in the via hole and forming a redistribution layer on the via plug, the via plug being connected to the upper pad;
attaching a carrier substrate onto the redistribution layer to face the support substrate and removing the support substrate;
forming a passivation layer on the upper pad and the fine pattern, the passivation layer having a contact hole that has a widening width further away from the carrier substrate in the vertical direction;
forming a contact plug in the contact hole, the contact plug being connected to the upper pad and comprising a material different from that of the via plug;
attaching a semiconductor chip onto the contact plug; and
forming a molding portion surrounding at least a side surface of the semiconductor chip.

12. The method of claim 11, wherein an upper surface of the upper pad, an upper surface of the fine pattern, and an upper surface of the silicon insulating layer are substantially coplanar with each other.

13. The method of claim 11, wherein the silicon insulating layer comprises silicon oxide or silicon nitride, and
wherein the pattern hole is formed by patterning the silicon insulating layer.

14. The method of claim 11, wherein a width of the contact plug narrows farther away from the semiconductor chip, and a width of the via plug widens farther away from the semiconductor chip.

15. The method of claim 11, wherein the via plug has a recess at a predetermined depth in a central portion of the via plug.

16. The method of claim 11, wherein the semiconductor chip comprises a plurality of semiconductor chips, and
wherein at least one of the plurality of semiconductor chips is a memory chip and at least one of the plurality of semiconductor chips is a controller.

17. The method of claim 16, further comprising:
after the forming the molding portion, forming a through electrode electrically connected to the plurality of semiconductor chips and penetrating through the molding portion.

18. The method of claim 11, further comprising:
after the attaching the semiconductor chip, forming an underfill filling between the semiconductor chip and the contact plug.

19. The method of claim 18, wherein the upper pad and the fine pattern do not contact the underfill.

20. The method of claim 11, wherein the insulating layer and the passivation layer comprise different materials.

* * * * *